United States Patent
Maturana et al.

(10) Patent No.: US 7,260,795 B2
(45) Date of Patent: Aug. 21, 2007

(54) METHOD AND APPARATUS FOR INTEGRATING A SIMULATION LOG INTO A VERIFICATION ENVIRONMENT

(75) Inventors: Guillermo Maturana, Berkeley, CA (US); Alok Kuchlous, Bangalore (IN)

(73) Assignee: Synopsys, Inc., Mountain View, CA (US)

( * ) Notice: Subject to any disclaimer, the term of this patent is extended or adjusted under 35 U.S.C. 154(b) by 415 days.

(21) Appl. No.: 11/018,513

(22) Filed: Dec. 20, 2004

(65) Prior Publication Data

US 2006/0136189 A1     Jun. 22, 2006

(51) Int. Cl.
G06F 17/50 (2006.01)
G06F 19/00 (2006.01)
G06F 7/02 (2006.01)
G06F 7/06 (2006.01)
G06F 7/22 (2006.01)
G06F 17/30 (2006.01)

(52) U.S. Cl. .............................. 716/4; 716/11; 703/16; 707/5

(58) Field of Classification Search .................. 716/4, 716/11; 703/16; 707/4, 5
See application file for complete search history.

(56) References Cited

U.S. PATENT DOCUMENTS

| | | | | |
|---|---|---|---|---|
| 5,220,512 A * | 6/1993 | Watkins et al. | ................ | 716/11 |
| 5,325,309 A * | 6/1994 | Halaviati et al. | .............. | 703/15 |
| 5,517,432 A * | 5/1996 | Chandra et al. | ............... | 703/14 |
| 5,539,680 A * | 7/1996 | Palnitkar et al. | .............. | 703/13 |
| 5,838,949 A * | 11/1998 | Hassoun | ........................ | 703/13 |
| 5,867,399 A * | 2/1999 | Rostoker et al. | ............... | 716/18 |
| 6,408,265 B1 * | 6/2002 | Schultz et al. | ................. | 703/22 |
| 6,434,517 B1 * | 8/2002 | Le | ............................... | 703/21 |
| 6,470,482 B1 * | 10/2002 | Rostoker et al. | ............... | 716/6 |
| 6,687,662 B1 * | 2/2004 | McNamara et al. | ........... | 703/14 |
| 6,754,763 B2 * | 6/2004 | Lin | ............................ | 710/317 |
| 6,810,442 B1 * | 10/2004 | Lin et al. | ....................... | 710/22 |
| 7,099,812 B2 * | 8/2006 | Boehm | ......................... | 703/17 |
| 7,124,376 B2 * | 10/2006 | Zaidi et al. | ..................... | 716/1 |

(Continued)

FOREIGN PATENT DOCUMENTS

JP     2001142385 A  *  5/2001

OTHER PUBLICATIONS

Fox et al., "Compressing Address Trace Data for Cache Simulations", Proceedings of Data Compression Conference, Mar. 25-27, 1997, p. 439.*

Primary Examiner—Phallaka Kik
(74) Attorney, Agent, or Firm—Park, Vaughan & Fleming LLP

(57) ABSTRACT

One embodiment of the invention provides a system that facilitates integrating a simulation log into a verification environment. The system operates by first creating the simulation log during a simulation of a register transfer language description of an integrated circuit design. Next, for each entry in the simulation log, the system places a corresponding entry in a "log entry table." When a user selects an entry from the simulation log, the system determines a file offset for the entry within the simulation log. Next, the system locates the corresponding entry in the log entry table. The system then uses the log entry table to locate entries within simulator state files, which describe which portion of the integrated circuit is being simulated. This enables the system to display the corresponding entries from the simulator state files to a user.

21 Claims, 4 Drawing Sheets

U.S. PATENT DOCUMENTS

| | | |
|---|---|---|
| 7,181,473 B1 * | 2/2007 | Lacouture et al. .......... 707/202 |
| 2002/0018066 A1 * | 2/2002 | Vizer .......................... 345/428 |
| 2002/0038401 A1 * | 3/2002 | Zaidi et al. ................. 710/305 |
| 2003/0093252 A1 * | 5/2003 | Frankel et al. ................ 703/13 |
| 2003/0122584 A1 * | 7/2003 | Boehm ....................... 326/105 |
| 2003/0125917 A1 * | 7/2003 | Rich et al. .................... 703/14 |
| 2003/0144828 A1 * | 7/2003 | Lin .............................. 703/21 |
| 2004/0117167 A1 * | 6/2004 | Neifert et al. ................ 703/14 |
| 2005/0144580 A1 * | 6/2005 | Berkram et al. ............... 716/6 |
| 2006/0122817 A1 * | 6/2006 | Baumgartner et al. ........ 703/14 |
| 2006/0161354 A1 * | 7/2006 | Mandema et al. ............ 702/19 |

* cited by examiner

METHOD AND APPARATUS FOR INTEGRATING A SIMULATION LOG INTO A VERIFICATION ENVIRONMENT

BACKGROUND

1. Field of the Invention

The invention relates to the process of verifying a design for an integrated circuit. More specifically, the invention relates to a method and an apparatus for integrating a simulation log, which is generated during simulation of the design, into a verification environment.

2. Related Art

During the design of an integrated circuit, designers typically use a high-level hardware design language such as Verilog or VHDL to create a register transfer language (RTL) description of the integrated circuit.

The RTL description is typically processed through a simulator to verify correct operation of the design. During this simulation, the simulator writes messages containing information generated during the simulation to a log file. These messages typically contain information related to key events which occur during the simulation run. Designers use this log file to review the operation of the integrated circuit design.

During a review of the log file (either during the simulation run or during post-processing of the simulation run), the designer typically locates an entry for an event of interest in the log file and attempts to correlate this entry with other files associated with the simulation. These other files can include: the RTL source, hierarchical views of circuits within the integrated circuit, and circuit waveforms generated during the simulation.

Unfortunately, in existing systems, the process of associating the entry in the log file to specific locations in the other files is a time-consuming manual process. Furthermore, because this process is manual, it is prone to errors, such as associating a log file entry with the wrong circuit, or associating a log file entry with the wrong portion of a waveform.

Hence, what is needed is a method and an apparatus for integrating a simulation log into a verification environment without the problems cited above.

SUMMARY

One embodiment of the invention provides a system that facilitates integrating a simulation log into a verification environment. The system operates by first creating the simulation log during a simulation of a register transfer language description of an integrated circuit design. Next, for each entry in the simulation log, the system places a corresponding entry in a "log entry table." When a user selects an entry from the simulation log, the system determines a file offset for the entry within the simulation log. Next, the system locates the corresponding entry in the log entry table. The system then uses the log entry table to locate entries within simulator state files, which describe which portion of the integrated circuit is being simulated. This enables the system to display the corresponding entries from the simulator state files to a user.

In a variation of this embodiment, the simulation log includes raw text entries describing events that occur during the simulation.

In a further variation, each entry in the log entry table identifies the simulation log and a corresponding entry in the simulation log.

In a further variation, the system displays the simulation log in a user interface. In this variation, the user selects an entry by locating the entry with a pointing device in the user interface, and selecting the entry by activating a button associated with the pointing device.

In a further variation, the simulator state files includes a source file containing register transfer language statements describing the integrated circuit; a wave file contains selected waveforms generated by the simulation; and a hierarchy file which specifies hierarchical relationships between the circuits comprising the integrated circuit.

In a further variation, a given entry in the log entry table specifies a simulation time, which can be used to access the wave file; a position in an instance tree, which can be used to access the hierarchy file; and a source identifier stack, which can be used to access the source files.

In a further variation, displaying the associated entries from the simulator state files to the user provides the user with an integrated view of the simulation.

DETAILED DESCRIPTION

Simulation System

Figure 1A:
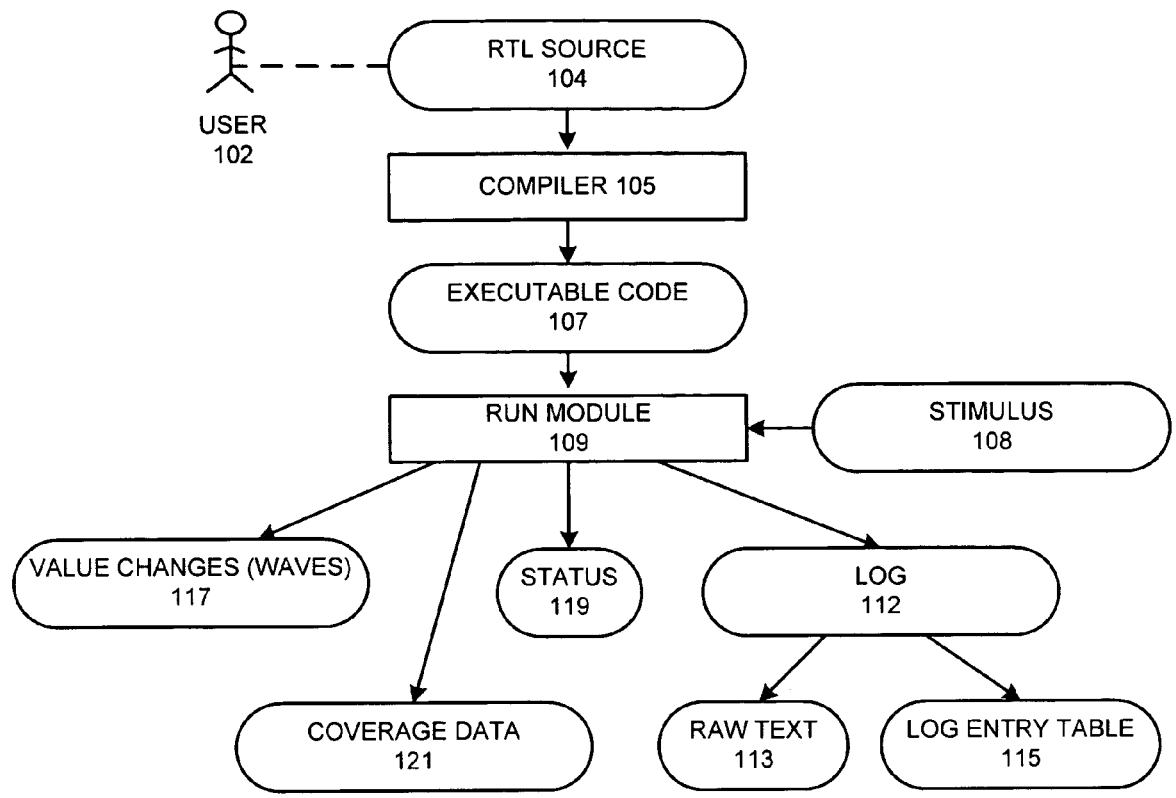
FIG. 1A illustrates data flow within a simulation system in accordance with an embodiment of the invention.

FIG. 1A illustrates data flow within a simulation system in accordance with an embodiment of the invention. A user 102 creates RTL source 104 describing an integrated circuit. Source 104 is processed through compiler 105 to create executable code 107. Executable code 107 and stimulus 108 are processed through run module 109 to simulate the design specified in RTL source 104.

During operation, run module 104 provides value changes (waves) 117, coverage data 121, status 119, and log 112. Log 112 is comprised of raw text 113 and log entry table 115.

Figure 1B:
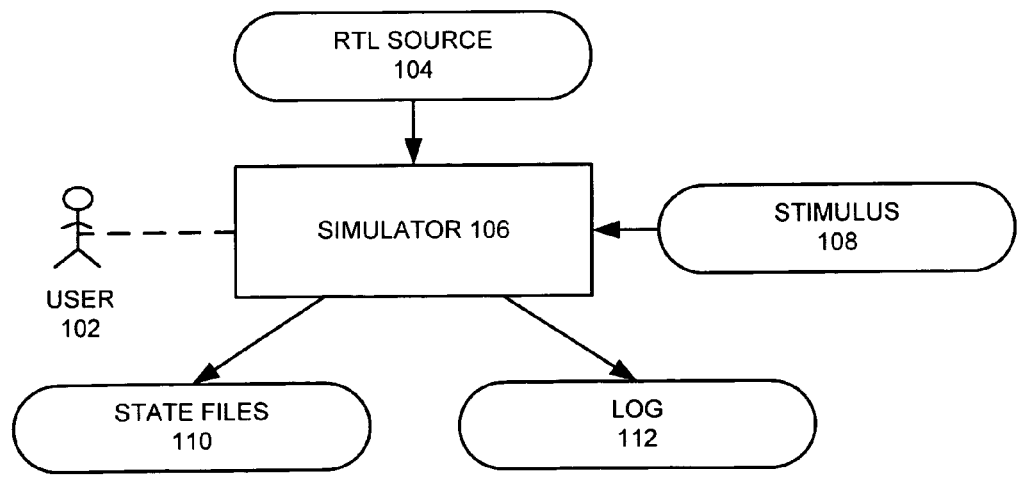
FIG. 1B illustrates a simulation system in accordance with an embodiment of the invention.

FIG. 1B illustrates the simulation system of FIG. 1A in accordance with an embodiment of the invention. This simulation system includes simulator 106, which receives input from RTL source 104 and stimulus 108. Simulator 106 includes compiler 105 and run module 109. As outputs, simulator 106 creates state files 110 and log 112. State files 110 include value changes (waves) 117, coverage data 121, and status 119. User 102 controls the operation of simulator 106 to exercise the integrated circuit design specified in RTL source 104. User 102 causes stimulus 108 to be applied to the various circuits comprising the integrated circuit. Stimulus 108 provides various state changes to drive the simulation. State files 110 and log 112 are described in more detail below with reference to FIGS. 2 and 3, respectively.

Simulation State Files

Figure 2:
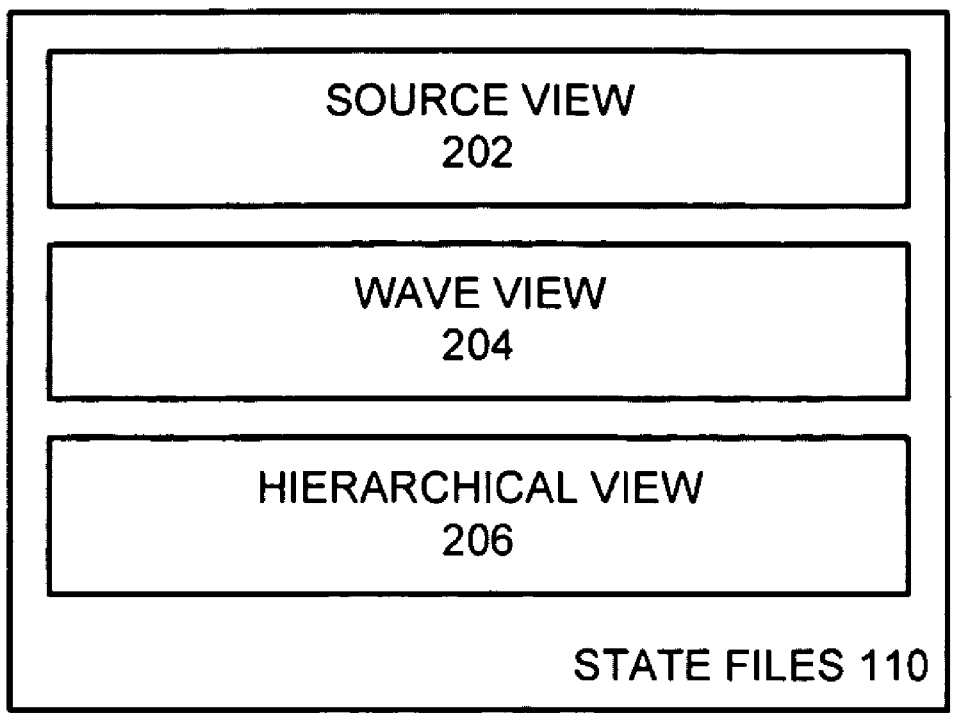
FIG. 2 illustrates simulation state files in accordance with an embodiment of the invention.

FIG. 2 illustrates simulation state files 110 in accordance with an embodiment of the invention. Simulation state files 110 include source view 202, wave view 204, and hierarchical view 206. Note that simulation state files 110 can include additional view files as desired.

Source view 202 displays the RTL source for the integrated circuit. Wave view 204 displays output waveforms generated during the simulation run of the integrated circuit. Finally, hierarchical view 206 displays the circuit hierarchy for the various circuits comprising the integrated circuit. Taken together, simulation state files 110 provide a continuous state output for the integrated circuit during a simulation run.

Simulation Log

Figure 3:
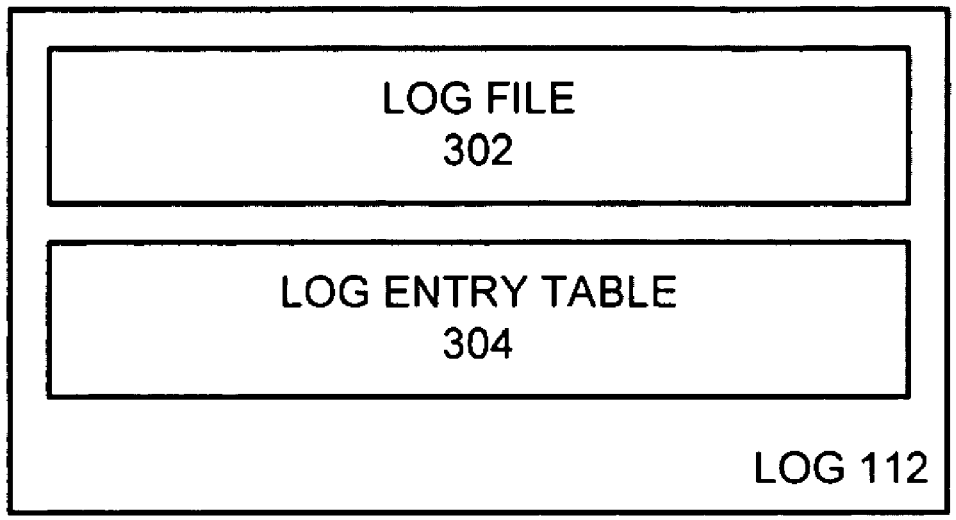
FIG. 3 illustrates a simulation log in accordance with an embodiment of the invention.

FIG. 3 illustrates a simulation log 112 in accordance with an embodiment of the invention. Simulation log 112 includes log file 302 and log entry table 304. Log file 302 stores the raw text for each event that is logged by the simulation. Log entry table 304 provides data to link the various files to the log file. The operation of the various portions of simulation log 112 is described in detail in conjunction with FIG. 4 below.

Simulation Log Details

Figure 4:
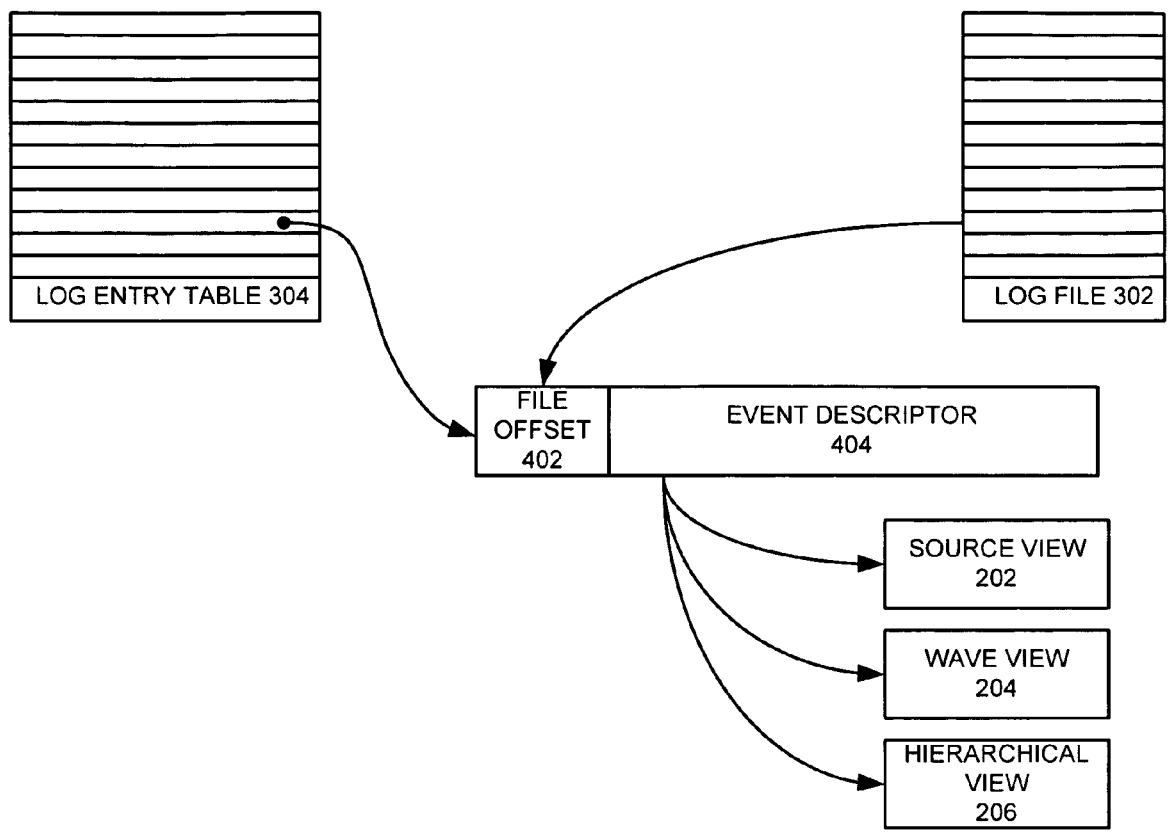
FIG. 4 illustrates details of a simulation log in accordance with an embodiment of the invention.

FIG. 4 illustrates details of a simulation log in accordance with an embodiment of the invention. During operation, each entry in log file 302 is stored at a given offset into log file 302. For each entry in log file 302, a corresponding entry is placed in log entry table 304. In one embodiment of the present invention, this corresponding entry contains file offset 402 and an event descriptor 404.

Event descriptor 404 stores the simulation time, a source line identifier for the source line from the source file that is being simulated, and a position indicator for the position in the hierarchy that is being simulated. Note that other information can be stored in event descriptor 404 and that additional view files can be supported.

During operation, a user can click on an entry in log file 302. The system determines the offset into log file 302 for the entry and then searches log entry table 304 for a matching record. Note that the search can be very fast if log entry table 304 is organized to be monotonically increasing. In this case, a binary search can be used to locate the matching entry. Alternatively, a lookup structure such as a hash table or a heap can be used.

After locating the matching entry, the system uses event descriptor 404 to access the associated data form source view 202, wave view 204, and hierarchical view 206. The entry from log file 302 and the associated data from the various view files are presented to the user on a computer display.

Creating a Simulation Log

Figure 5:
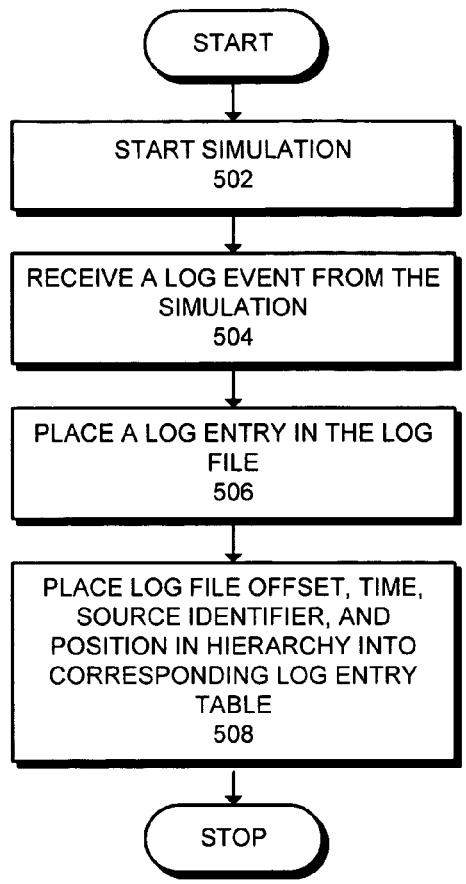
FIG. 5 presents a flowchart illustrating the process of creating a simulation log in accordance with an embodiment of the invention.

FIG. 5 presents a flowchart illustrating the process of creating a simulation log in accordance with an embodiment of the invention. The system starts when a simulation of an integrated circuit design is started (step 502). Next, the system receives a log event from the simulation (step 504). This event in general can be associated with any event of interest to the designer, and is typically in the form of a message generated during the simulation.

After receiving the log event, the system places a log entry in the log file (step 506). Finally, the system places the log file offset, the simulation time, a source line identifier from the source file, and the position in the integrated circuit's hierarchy into a corresponding log entry table (step 508). Note that additional data can be placed into the log entry table.

Using the Simulation Log

Figure 6:
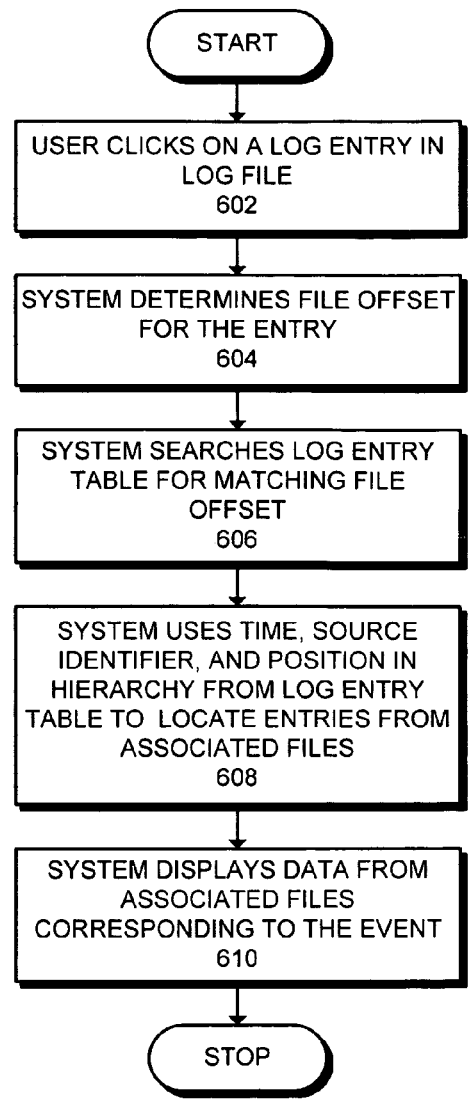
FIG. 6 presents a flowchart illustrating the process of using a simulation log in accordance with an embodiment of the invention.

FIG. 6 presents a flowchart illustrating the process of using a simulation log in accordance with an embodiment of the invention. The system starts when a user clicks on a log entry in the log file (step 602). Next, the system determines the file offset within the log file for the entry (step 604).

After determining the offset, the system searches the log entry table for a matching file offset (step 606). Note that entries in the log entry table can be monotonically increasing to allow use of a fast search technique such as a binary search.

Upon finding the matching entry for the log entry in the log entry table, the system uses the data in the matching entry to locate entries within the associated simulation state files (step 608). Specifically, the time value can be used to locate a position in the wave view corresponding to the logged event, the source identifier can locate the source line within the design source file that is being simulated, and the hierarchy position can be used to locate where the circuit resides in the hierarchy of the integrated circuit. Note that additional data in the log entry table can be used to locate other associated data.

The system then displays the log entry and the associated data from the simulation state files to a user (step 610). The user can use this correlated information to examine the progress of the simulation and to determine exactly what is happening within the simulation when the event is logged.

CONCLUSION

The foregoing description is presented to enable one to make and use the invention, and is provided in the context of a particular application and its requirements. It is not intended to be exhaustive or to limit the invention to the forms disclosed. Various modifications to the disclosed embodiments will be readily apparent, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein. Accordingly, many modifications and variations will be apparent. The scope of the invention is defined by the appended claims.

The data structures and code described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Note that the invention can be applied to any type of lithographic process for fabricating semiconductor chips, including processes that make use of, deep-ultraviolet (DUV) radiation, extreme ultraviolet (EUV) radiation, X-rays, and electron beams, along with suitably modified masks.

What is claimed is:

1. A method for integrating a simulation log into a verification environment, comprising:
    creating the simulation log during a simulation of a register transfer language description of an integrated circuit design;
    for each entry in the simulation log, placing a corresponding entry in a log entry table;
    upon receiving a selection of an entry from the simulation log,
        determining a file offset for the selected entry within the simulation log;
        locating a corresponding entry in a log entry table;
        using the corresponding entry in the log entry table to locate corresponding entries within simulator state files; and
        displaying the corresponding entries from the simulator state files to a user.

2. The method of claim 1, wherein the simulation log includes entries describing events that occur during the simulation.

3. The method of claim 2, wherein each entry in the log entry table identifies a simulation log and a corresponding entry in the simulation log.

4. The method of claim 1, wherein receiving the selection of the entry from the simulation log involves:
    displaying the simulation log in a user interface;
    allowing the user to locate the entry with a pointing device in a graphical user interface; and
    allowing the user to select the entry by activating a button on the pointing device.

5. The method of claim 1, wherein the simulator state files include:
    a source file containing register transfer language statements describing the integrated circuit;
    a wave file containing selected waveforms generated by the simulation of the integrated circuit; and
    a hierarchy file which specifies hierarchical relationships between the circuits comprising the integrated circuit.

6. The method of claim 5, wherein a given entry in the log entry table specifies:
    a simulation time, which is used to access the wave file;
    a position in an instance tree, which is used to access the hierarchy file; and
    a source identifier stack, which is used to access the source files.

7. The method of claim 1, wherein displaying the corresponding entries from the simulator state files to the user provides the user with an integrated view of the simulation.

8. A computer-readable storage medium storing instructions that when executed by a computer cause the computer to perform a method for integrating a simulation log into a verification environment, the method comprising:
    creating the simulation log during a simulation of a register transfer language description of an integrated circuit design;
    for each entry in the simulation log, placing a corresponding entry in a log entry table;
    upon receiving a selection of an entry from the simulation log,
        determining a file offset for the selected entry within the simulation log;
        locating a corresponding entry in a log entry table;
        using the corresponding entry in the log entry table to locate corresponding entries within simulator state files; and
        displaying the corresponding entries from the simulator state files to a user.

9. The computer-readable storage medium of claim 8, wherein the simulation log includes entries describing events that occur during the simulation.

10. The computer-readable storage medium of claim 9, wherein each entry in the log entry table identifies a simulation log and a corresponding entry in the simulation log.

11. The computer-readable storage medium of claim 8, wherein receiving the selection of the entry from the simulation log involves:
    displaying the simulation log in a user interface;
    allowing the user to locate the entry with a pointing device in a graphical user interface; and
    allowing the user to select the entry by activating a button on the pointing device.

12. The computer-readable storage medium of claim 8, wherein the simulator state files include:
    a source file containing register transfer language statements describing the integrated circuit;
    a wave file containing selected waveforms generated by the simulation of the integrated circuit; and
    a hierarchy file which specifies hierarchical relationships between the circuits comprising the integrated circuit.

13. The computer-readable storage medium of claim 12, wherein a given entry in the log entry table specifies:
    a simulation time, which is used to access the wave file;
    a position in an instance tree, which is used to access the hierarchy file; and
    a source identifier stack, which is used to access the source files.

14. The computer-readable storage medium of claim 8, wherein displaying the corresponding entries from the simulator state files to the user provides the user with an integrated view of the simulation.

15. An apparatus for integrating a simulation log into a verification environment, comprising:
    a simulation log creating mechanism configured to create the simulation log during a simulation of a register transfer language description of an integrated circuit design;
    an entry placing mechanism configured to place an entry in a log entry table related to each entry in the simulation log;
    a selecting mechanism configured to select an entry from the simulation log;
    an offset determining mechanism configured to determine a file offset for the selected entry within the simulation log;
    a locating mechanism configured to locate a corresponding entry in a log entry table for the selected entry;
    a processing mechanism configured to use the corresponding entry in the log entry table to locate corresponding entries within simulator state files, wherein the simulator state files describe which portion of the integrated circuit is being simulated; and
    a displaying mechanism configured to display the corresponding entries from the simulator state files to a user.

16. The apparatus of claim 15, wherein the simulation log includes entries describing events that occur during the simulation.

17. The apparatus of claim 16, wherein each entry in the log entry table identifies a simulation log and a corresponding entry in the simulation log.

18. The apparatus of claim 15, wherein the selection of the entry from the simulation log involves:
    displaying the simulation log in a user interface;

allowing the user to locate the entry with a pointing device in a graphical user interface; and allowing the user to select the entry by activating a button on the pointing device.

19. The apparatus of claim 15, wherein the simulator state files include:

a source file containing register transfer language statements describing the integrated circuit;

a wave file containing selected waveforms generated by the simulation of the integrated circuit; and a hierarchy file which specifies a hierarchical relationships between the circuits comprising the integrated circuit.

20. The apparatus of claim 19, wherein a given entry in the log entry table specifies:

a simulation time, which is used to access the wave file;

a position in an instance tree, which is used to access the hierarchy file; and a source identifier stack, which is used to access the source files.

21. The apparatus of claim 15, wherein displaying the corresponding entries from the simulator state files to the user provides the user with an integrated view of the simulation.

* * * * *